United States Patent [19]

Sato

[11] 4,129,791
[45] Dec. 12, 1978

[54] SOLID STATE SWITCHING CIRCUIT

[75] Inventor: Ryuichi Sato, Muko, Japan

[73] Assignee: Omron Tateisi Electronics Co., Kyoto, Japan

[21] Appl. No.: 777,647

[22] Filed: Mar. 15, 1977

Related U.S. Application Data

[63] Continuation of Ser. No. 633,817, Nov. 20, 1975, abandoned.

[30] Foreign Application Priority Data

Nov. 29, 1974 [JP] Japan .................................. 49/138756

[51] Int. Cl.² ........................................... H03K 17/72
[52] U.S. Cl. ............................ 307/252 Q; 307/252 B; 307/252 UA; 307/311
[58] Field of Search ........... 307/252 B, 252 N, 252 Q, 307/252 T, 252 UA, 311; 323/18, 21, 225 L

[56] References Cited

U.S. PATENT DOCUMENTS

| 3,328,606 | 6/1967 | Pinckaers | 307/252 B |
| 3,723,769 | 3/1973 | Collins | 307/252 UA |
| 3,917,962 | 11/1975 | Pascente | 307/252 B |
| 3,935,482 | 1/1976 | Fox, Jr. et al. | 307/252 B |

Primary Examiner—John Zazworsky
Attorney, Agent, or Firm—Cushman, Darby & Cushman

[57] ABSTRACT

This invention relates to an improved solid state switching circuit for switching an A.C. load current fed from an A.C. power supply in response to values of input signal. The improvement is that, a pair of thyristors are provided in the circuit, for each to share the switching of positive and negative parts, respectively, of the load current to pass when the power supply voltage is near or at zero.

Thus each thyristor switches very exactly in response to the values of input signal and power supply voltage, without accidental turning-ons after removal of the input signal, which have been frequently observed.

4 Claims, 4 Drawing Figures

SOLID STATE SWITCHING CIRCUIT

This is a continuation of application Ser. No. 633,817 filed Nov. 20, 1975, now abandoned.

BACKGROUND OF THE INVENTION

Hitherto, a solid state relay circuit which switches an A.C. load current responsive to an input signal to the input circuit electrically isolated from the load circuit and is provided with a zero-cross firing means has been known, for instance, by the U.S. Pat. No. 3,723,769 on the invention of Collins, et al. assigned to International Rectifier Corporation or by the U.S. Pat. No. 3,648,075 on the invention of Mankovitz assigned to Teledyne Incorporated. In these known solid state relays, it was necessary to provide full-wave rectifier circuits to feed rectified full-wave currents to thyristors or triacs. Moreover, each of these circuits has one thyristor or triac, which is connected in a manner to be switched "on" at every rising-up of both positive and negative parts of the load current, and is for regulating the zero-cross firing operation. The present inventor found a fact that, thyristors or triacs are liable to accidental turning-ons even without input signal at the gate. Such accidental operation is such that when a ripple current obtained by means of the full-wave rectifier is applied to its gate, the thyristor or the triac is liable to an accidental turning-ons even at small noises in the anode-cathode voltage thereof or at an excessive dV/dt value exceeding the so-called critical off-voltage-rise-up ratio of the anode-cathode voltage.

SUMMARY OF THE INVENTION

Therefore, according to the present invention, a pair of thyristors, namely one for positive part and the other for negative part, respectively, of the rectified full-wave current are provided. As a result of such constitution that each thyristor shares a positive or negative part of the current, respectively, ripple peaks of the anode-cathode voltage in each thyristor are separated by pause intervals inbetween, and accordingly, accidental switching "on" of the thyristor in the absence of input signal at the gate is avoided, resulting in very exact operation.

Moreover, on account of the insertion of the above-mentioned pause intervals, it was empirically found that the capacity as well as durability of the thyristor are much improved.

DETAILED DESCRIPTION OF THE INVENTION

Figure 1:
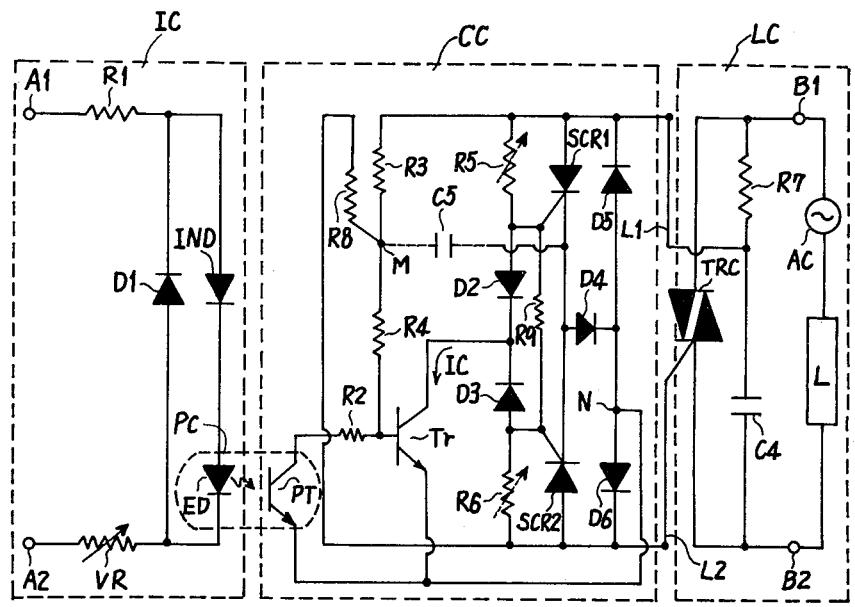
FIG. 1 is a circuit diagram of one example of the present invention.

The solid state switching circuit of the present invention comprises:

(1) an input circuit(IC) which receives input signal and produces a physical signal and (2) a control circuit(CC) which is electrically isolated from the input circuit(IC) and controls output signal in response to the physical signal, wherein said control circuit(CC) comprises a transducer(PT) such as phototransistor which receives said physical signal and transduces it into an electric signal, a zero-cross firing circuit in which a transistor Tr is controlled in resonse to the instantaneous values of the A.C. voltage at the load circuit(LC) and in response to said input signal, and a pair of thyristors(SCR1 and SCR2) which operate to share switching of the positive part and the negative part, respectively, of the load current, the gates of both thyristors being connected in a manner that the output of said transistor Tr controls the thyristors SCR1 and SCR2.

In the input circuit IC, input terminals A1 and A2 are for receiving D.C. input signals therefrom. A resistor R1, a first light-emitting diode IND for indicating an incoming of the input signal, a second light-emitting diode ED for producing an optical signal responding to the input signal, and a variable resistor VR for controlling the intensity of the optical signal are connected in series across the terminals A1 and A2. A diode D1 is connected across a part of the series connection of the first and the second light-emitting diodes in order to protect them from possible surge pulse from the input terminals A1 and A2.

The load circuit LC comprises a load L connected in series to the A.C. power source AC across the terminals B1 and B2. A switching device TRC such as triac is connected across the terminals B1 and B2 by the first and second electrodes thereof. A resistor R7 and a capacitor C4 are connected in series across the terminals B1 and B2. The gate of the switching device TRC and the junction point between the resistor R7 and the capacitor C4 are connected to the connecting lines L2 and L1, respectively. The resistor R7 and the capacitor C4 constitute a noise-elimination circuit for eliminating noises from the power line or power sources.

The control circuit CC includes a part of so-called zero-cross firing means. The lines L1 and L2 connecting to the load circuit LC serve to feed power to operate the control circuit CC. Also, the lines L1 and L2 serve to feed the gate current to the triac TRC. Across the lines L1 and L2, the first thyristor SCR1 and the second thyristor SCR2 are connected by their anodes, respectively, and also a first diode D5 and a second diode D6 are connected by their cathodes, respectively. The cathodes of the thyristors SCR1 and SCR2 are connected in common to the anodes of a voltage dropping diode D4, and the anodes of the diodes D5 and D6 are connected in common at the junction point N to the cathodes of the diode D4. The circuit consisting of the thyristor SCR1 and SCR2 and the diodes D4, D5 and D6 is for producing gate signal to be fed to the gate for controlling the triac TRC. The abovementioned thyristors are controlled to be "on" or "off" by control signals fed to the gates of the thyristors SCR1 and SCR2 through resistors R5 and R6, respectively.

The circuit comprising the phototransistor PT and the transistor Tr is for controlling the abovementioned gate signals for the thyristors SCR1 and SCR2. The phototransistor PT as the transducer and the light-emitting diode ED are disposed in a manner that the former receives the light emitted from the latter and that the former and the latter are electrically isolated from each other. Thus, the light-emitting diode ED and the phototransistor PT constitute a known photo-coupler. Resistors R3, R4 and R2 and the phototransistor PT are connected in series across the line L1 and the junction point N between the anodes of the diodes D5 and D6. This series circuit constitutes a voltage dividing circuit for producing a voltage signal proportional to the instantaneous value of source voltage. A resistor R8 is connected across the line L2 and the junction point M which is between the resistors R3 and R4. The junction point between the resistors R4 and R2 is connected to the base of the transistor Tr. The resistor R2 serves to decrease undesirable influences of ambient temperature and to appropriately attenuate the electric signal which is produced by transducing the physical signal. The resistors R3 and R8 are selected to be of the same or similar resistance. The gates of the thyristors SCR1 and SCR2 are, through the diodes D2 and D3, respectively, connected to the collector of the transistor Tr, and the diodes D2 and D3 are connected in such direction as to allow currents to flow therethrough to the collector of the transistor Tr. A resistor R9 is connected across the gates of the thyristors SCR1 and SCR2. This resistor R9 serves to discharge undesirable electric charges accumulating in depletion layer around the gate regions of the thyristors SCR1, SCR2, in order to prevent accidental turning-ons due to such accumulating charges. Across the gate and the anode of the thyristor SCR1, a resistor R5 is connected, and across the gate and the anode of the thyristor SCR2 a resistor R6 is connected. The emitter of the transistor Tr is connected together with the emitter of the phototransistor PT to the aforementioned junction point N between the anodes of the diodes D5 and D6. A capacitor C5 is connected across the aforementioned junction point M and the cathodes of the thyristors SCR1 and SCR2 for compensating the influence of phase difference between the load current and the voltage applied to the zero-cross firing means, when the load L is an inductive load.

OPERATION OF THE CIRCUIT

Figure 2:
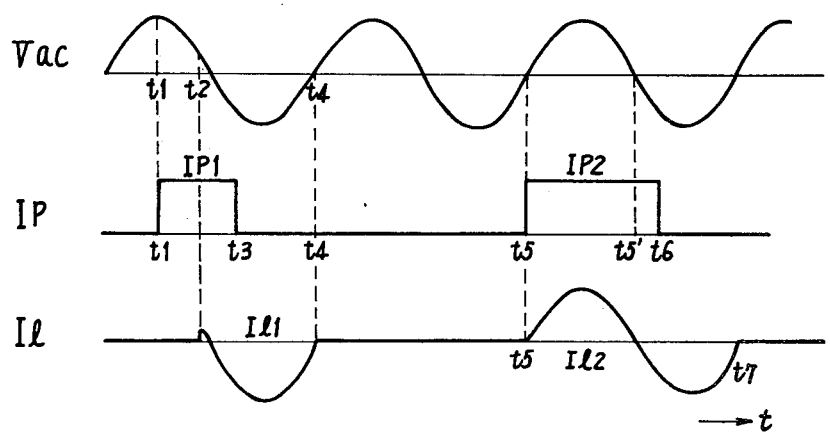
FIG. 2 is a time chart showing wave forms of various parts of the circuit of FIG. 1.

The operation and function of the circuit of FIG. 1 is elucidated referring to FIG. 2, which shows time charts of the instantaneous voltage Vac of the A.C. power source AC, the change of intensity of the light IP received by the phototransistor PT and the instantaneous value of the load current I1.

1. In case that the specified input signal is impressed across the input terminals A1 and A2:

(1.1) and when the instantaneous voltage across the lines L1 and L2, namely, across the first and second electrodes of the triac, is larger than a preset zero-cross threshold voltage (for instance 5V):

When the input signal is impressed across the terminals A1 and A2 at the time t1 when the source voltage Vac is at its positive peak, then the phototransistor PT is of low resistance, but the divided voltage impressed across the base and emitter of the transistor Tr becomes high on account of high peak value Vac across the lines L1 and L2. On account of the high base-emitter voltage, the transistor Tr becomes "on". Therefore, when the terminals B1 and B2 are of positive and negative voltages, respectively, a first current path of AC-B1-R7-L1-R5-D2-Tr-N-D6-the gate to the second electrode of TRC-B2-L-AC is completed. On the other hand, when the terminal B1 and B2 are of negative and positive voltages, respectively, a second current path of AC-L-B2-the second electrode to the gate of TRC-L2-R6-D3-Tr-N-D5-L1-R7-B1-AC is completed. As a result of the completion of the first path, namely, as a result of shunting by the first path, the gate of the first thyristor SCR1 fails to receive its gate current which, otherwise, should flow in a third path of AC-B1-R7-L1-R5-the gate to the cathode of SCR1-D4-N-D6-L2-the gate to the second electrode of TRC-B2-L-AC. Similarly, as a result of the completion of the second path, namely, as a result of shunting by the second path, the gate of the second thyristor SCR2 fails to receive its gate current which, otherwise, should flow in a fourth path of AC-L-B2-the second electrode to the gate of TRC-L2-R6-the gate to the cathode of SCR2-D4-D5-L1-R7-B1-AC. Accordingly, neither thyristors SCR1 nor SCR2 turns on.

(1.2) When the source voltage Vac becomes smaller than the specified zero-cross threshold voltage:

Namely, immediately after the time t2 in FIG. 2, the transistor Tr becomes off, since divided voltage appearing across the resistor R2 and the phototransistor PT becomes low (since the resistance of the phototransistor PT is low). Accordingly, the abovementioned first and second shunting paths are not formed, and therefore, the thyristors SCR1 and SCR2 receive their gate currents through the abovementioned third and fourth paths, respectively. Therefore, the thyristors SCR1 and SCR2 alternately turn on as the positive and negative currents alternately flow. Namely, the first thyristor SCR1 shares to turn "on" when the terminal B1 is positive and the second thyristor SCR2 shares to turn "on" when the terminal B2 is positive.

As a result of the alternate turning-ons of the thyristors SCR1 and SCR2, the gate of the triac TRC receives sufficient triggering currents in sequence by a fifth path of AC-B1-R7-L1-SCR1-D4-D6-L2-the gate to the second electrode of TRC-B2-L-AC and by a sixth path of AC-L-B2-the second electrode to the gate of TRC-L2-SCR2-D4-D5-L1-R7-B1-AC, respectively. By means of the triggering current through the abovementioned fifth and sixth paths, the triac TRC is triggered for both positive and negative parts of the load current and allows a full-load current I1 to flow through the load L. Thus the load current I1 flows from the time t2 to the time t4 when the triac TRC turns off on account of distinguishing of the current therethrough (as indicated by I11 in FIG. 2).

Thus, the abovementioned circuit has the zero-cross firing function.

2. In case that the input signal is impressed at the time when the source voltage is smaller than the zero-cross threshold value:

This case is shown in FIG. 2 by the light intensity (IP2). As has been elucidated in the foregoing descriptions, the transistor Tr is "off" on account of the small source voltage. Therefore, the thyristors SCR1 and SCR2 becomes "on" upon rising up of the light intensity at the time t5, and resultantly, the triac TRC is triggered to allow the load current to flow from the time t5. When the light intensity lasts "on" after a falling-down and a negative rising-up of the source voltage Vac (as shown by the period between t5' to t6), then the triac turns on again. The triac becomes "off" at the time t7 when the source voltage Vac becomes smaller than the zero-cross threshold level for the first time after the fall-down of the light intensity at the time t6. Thus the A.C. load current I1 flows for the period of from t5 to t7 as indicated by I12 in FIG. 2).

3. In case that the input signal is absent:

In this case, the phototransistor PT becomes "off", namely, of high resistance, and accordingly, the divided voltage impressed across the base and the emitter of the transistor Tr becomes larger in the ratio to the source voltage. Therefore, the transistor Tr is "on" until the source voltage becomes almost zero. By the "on" state of the transistor Tr, the gate currents of the thyristors SCR1 and SCR2 become cut off thereby making the thyristors SCR1 and SCR2 "off", and accordingly the triac TRC does not turn on.

According to the present invention, the thyristors are provided in a pair for alternately switching the positive and negative parts, respectively, of the A.C. current. Therefore, the current in the thyristor has rippled peaks isolated by the pause times, respectively. This pause time is found very advantageous in preventing the thyristor from accidental turn-ons in the absence of gate signal. The present inventors found that the thyristor attains satisfactory exactness in turning on or off and durability even under such heavy-duty operation that the switched current flowing therethrough is more than the value that has damaged the thyristors of the same capacity in the conventional use with consecutive full-wave rippled current flowing without pause. Moreover, since the two thyristors are employed, switched current, hence burden on each thyristor, becomes half of the conventional circuit, and hence, the life of the thyristor can be prolonged.

Besides, the phototransistor PT serves as an element of the photo-coupler means and, at the same time, as a resistor of the voltage divider for attaining the zero-cross firing function. Furthermore, the transistor Tr serves to control the thyristors SCR1 and SCR2 so as to attain the zero-cross firing function and also serves to inverse the polarity of the output of the phototransistor PT.

For the inductive load, the capacitor C5 serves to compensate the phase lag of the load current. Namely, the capacitor C5, together with the resistors R3 or R8, constitutes a delay circuit, and the voltage which is relatively leading to the inductive-load current is appropriately delayed when divided by the dividing circuit of R3-R4-R2-PT or R8-R4-R2-PT and impressed to the base of the transistor Tr thereby appropriately compensating the phase of the triggering signal. Therefore, even for the inductive load, the triac TRC can be satisfactorily triggered without failure of firing on account of phase error or the triggering signal.

Modified Example 1

As a modified example, the sensitivities of the gates of the thyristors SCR1 and SCR2 can be set to be different from each other, by selecting a specified pair of thyristors, and the pair of the resistors R5 and R6 are set to be of substantially equal resistance. By so setting the following operation is possible.

When the input signal is of intermediate value between "on" and "off" signals

Figure 3:
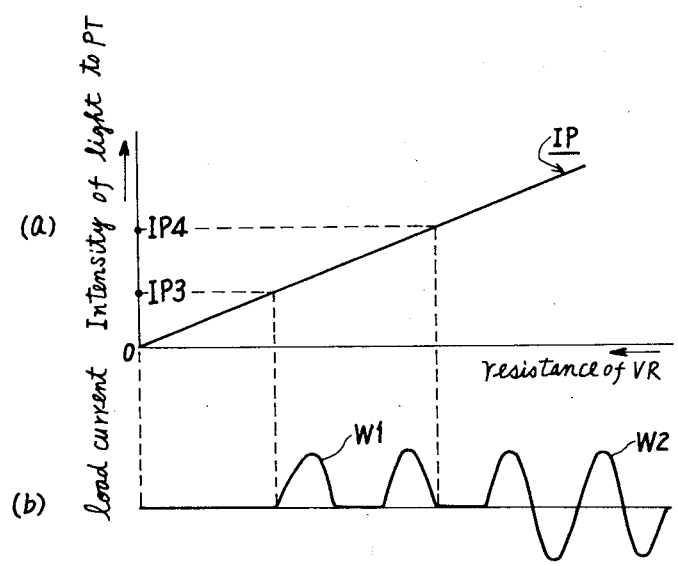
FIGS. 3(a) and (b) are charts showing the function of a modified example.

In such a case, the phototransistor PT shows an intermediate resistance between the "on" state and the "off" state. Accordingly, the transistor Tr also becomes intermediate state between the "on" and "off", making its collector current intermediate between the two states. Since one of the thyristors, for instance SCR1, is made to have greater gate sensitivity, only thyristor SCR1 becomes "on" for every cycle, and the other thyristor SCR2 remains "off" for the same period. Therefore, the triac TRC is triggered only for positive half parts of every cycle, making the resultant current to be ½ (i.e., 50%) of the ordinary "on" state. Accordingly, as shown in FIG. 3(a) and FIG. 3(b), as the intensity of the emitted light is gradually raised by, for instance, changing the resistance of the variable resistor VR, the load current is zero for the range of from zero to IP3 of the light intensity, the load current becomes half-wave rippled current for the range of from IP3 to IP4 of the light intensity, and the load current becomes full-wave i.e., normal sine-wave current for the range of over IP4 of the light intensity.

Switching the current in the abovementioned three steps (i.e., 0%, 50% and 100%) of output amounts can be utilized for various purposes, for instance, for electric heater of adjustable wattages or electric lamp of adjustable luminosities.

When a traffic signal light is lit by employing the present invention, the wave form of the current is always in good sine-wave form on account of zero-cross-firing means, and therefore, life of the signal lamp can be prolonged. Moreover, when any failure in the system of the input signal happens, such as a decrease of the input signal, then the lamp wattage becomes half, thereby warning of an occurrence of the failure. Furthermore, if one of the thyristors happens to have a shortcircuiting trouble, the lamp is lit in the absence of input signal at the half-wave current, by means of the short-circuited thyristor. If one of the thyristors happens to have a cut off trouble, the lamp is lit at normal input signal with half-wave current through normal thyristor, and is not lit without the input signal. The abovementioned results can be used as warning signs of occurrences of some troubles in the circuit, and therefore, the reliability of the solid state switching circuit is increased.

Modified Example 2

As another modified example, the resistors R5 and R6 which are connected across the anodes and the gates of the thyristors SCR1 and SCR2, respectively, are made as adjustable resistors. Then, the adjustable resistors R5 and R6 are adjusted to have different resistances from each other. Provided that the variable-resistor R5 is set to have smaller resistance than the variable resistor R6, then for an input signal of an intermediate value between "off" and normal "on" value, only the thyristor SCR1 becomes "on" and makes the load current half-wave rippled wave, similarly to the aforementioned Modified Example 1.

Modified Example 3

Figure 4:
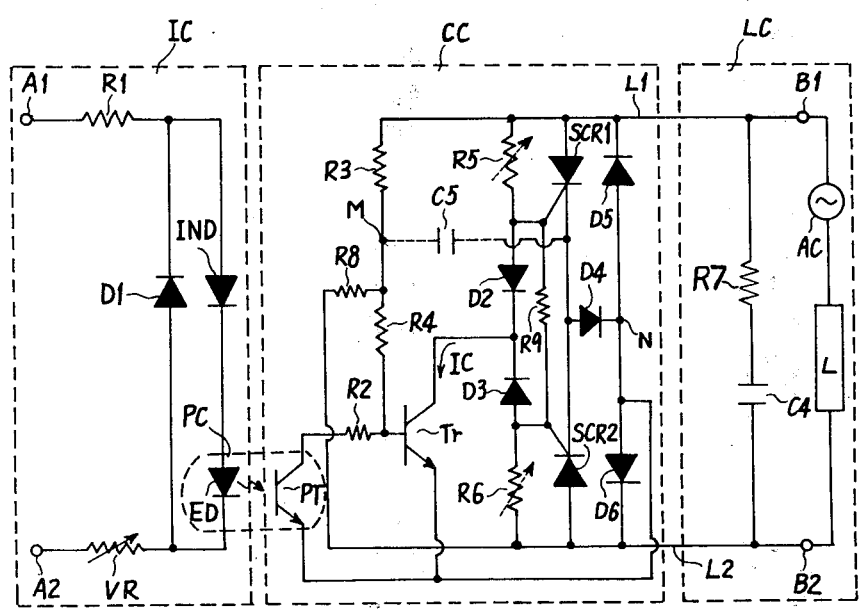
FIG. 4 is a circuit diagram of another modified example.

FIG. 4 shows still another example of the present invention, wherein no triac is employed and the load current is directly switched by a pair of the thyristors SCR1 and SCR2. Other parts remain similar to the foregoing examples. This circuit is applicable when the load current is not very great.

What is claimed is:
1. A solid state switching circuit comprising:
   an input signal circuit for receiving an input signal and producing a physical signal, and
   a load circuit including a load and an A.C. power source connected in series between first and second load terminals,
   a control circuit which is electrically isolated from the input circuit and coupled between said first and second load terminals to control application of load current from said A.C. power source to said load in response to the physical signal,
   wherein said control circuit comprises a transducer which receives said physical signal and transduces it into an electric signal, a zero-cross firing circuit including a single transistor controlled in response to the instantaneous values of A.C. voltage at said first and second load terminals and in response to said electric signal from said transducer, and a pair of thyristors connected in series and in opposite direction to each other and coupled across said first and second load terminals, said thyristors switching the positive part and the negative part, respectively, of the load current from the A.C. power source to the load, the gates of both thyristors being commonly coupled to one of the collector and the emitter terminals of said single transistor, the other of the collector and emitter terminals of said single transistor being coupled to the anodes of both said thyristors.

2. A solid state switching circuit of claim 1, wherein the transducer is a phototransistor which is connected as a resistor of a voltage dividing circuit for detecting the instantaneous values of the A.C. voltage.

3. A solid state switching circuit as defined in claim 1 which further comprises a switching device having a gate electrode and first and second other electrodes, said first and second other electrodes connected in series between said first and second load terminals, and wherein said pair of thyristors are connected in series with their cathodes to each other and the series connection of the thyristors is operatively connected across the gate electrode and the first other electrode of said switching device, a first pair of diodes connected in series and with their anodes to each other, the series connection of the first pair of diodes being operatively connected across said gate electrode and said first other electrode of said switching device, a second pair of diodes connected in series and with their cathodes to each other, the respective anodes of said second pair of diodes connected to the respective gates of said thyristors, said one of the collector and emitter terminals of said single transistor being connected to said cathodes of said second pair of diodes and said other of the collector and emitter terminals of the single transistor being connected to the connection point between said series connection of said first pair of diodes and further through an additional diode to the connection point between said series connected thyristors, said additional diode being connected by its anode to the cathodes of said thyristors.

4. A solid state switching circuit of claim 2, wherein the input signal circuit comprises a first light-emitting diode which emits a light to be received by the phototransistor, and a second light-emitting diode which is connected in series with said first light-emitting diode for visually indicating the state of the input signal, hence the operating state of the output circuit.

* * * * *